United States Patent
Franosch et al.

(10) Patent No.: US 7,682,777 B2
(45) Date of Patent: Mar. 23, 2010

(54) METHOD FOR PRODUCING A POLYMER STRUCTURE ON A SUBSTRATE SURFACE

(75) Inventors: Martin Franosch, Munich (DE); Andreas Meckes, Munich (DE); Klaus-Guenter Oppermann, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 257 days.

(21) Appl. No.: 11/387,055

(22) Filed: Mar. 22, 2006

(65) Prior Publication Data
US 2006/0240643 A1   Oct. 26, 2006

(30) Foreign Application Priority Data
Mar. 22, 2005  (DE) .................. 10 2005 013 300

(51) Int. Cl.
*G03F 7/00* (2006.01)
(52) U.S. Cl. .............. 430/311; 430/271.1; 430/330
(58) Field of Classification Search ............. 430/311, 430/330, 271.1
See application file for complete search history.

(56) References Cited

U.S. PATENT DOCUMENTS

| | | | |
|---|---|---|---|
| 4,027,181 A | * | 5/1977 | Moreillon et al. ........... 310/348 |
| 6,746,819 B1 | | 6/2004 | Schmitz et al. |
| 2002/0076651 A1 | * | 6/2002 | Hurditch et al. .......... 430/280.1 |
| 2005/0164118 A1 | * | 7/2005 | Barholm-Hansen et al. ....................... 430/270.1 |
| 2005/0255233 A1 | * | 11/2005 | Madou et al. .............. 427/96.1 |

FOREIGN PATENT DOCUMENTS

| | | |
|---|---|---|
| DE | 199 55 969 A1 | 5/2001 |
| DE | 103 23 350 A1 | 12/2004 |
| WO | WO 2004/104704 A3 | 2/2004 |

OTHER PUBLICATIONS

Franosch et al. "Wafer-Level-Package for Bulk Acoustic Wave (BAW) Filters." *Microwave Symposium Digest.* (2004): pp. 493-496.
Zhang et al. "Polymerization optimization of SU-8 photoresist and its applications in microfluidic systems and MEMS." *Journal of Micromechanics and Microengineering.* vol. 11. (2001): pp. 20-26.

* cited by examiner

*Primary Examiner*—Thorl Chea
(74) *Attorney, Agent, or Firm*—Maginot, Moore & Beck

(57) ABSTRACT

A method for producing a polymer structure on a patterning region of a substrate surface includes the steps of depositing an adhesion layer having a first polymer material onto the substrate surface, patterning the adhesion layer such that the first polymer material of the adhesion layer is removed in a first region and the first polymer material of the adhesion layer remains in a second region including the patterning region, depositing a polymer layer of a second polymer material onto the substrate surface and the adhesion layer and patterning the polymer layer such that the polymer structure forms in the second region.

15 Claims, 3 Drawing Sheets

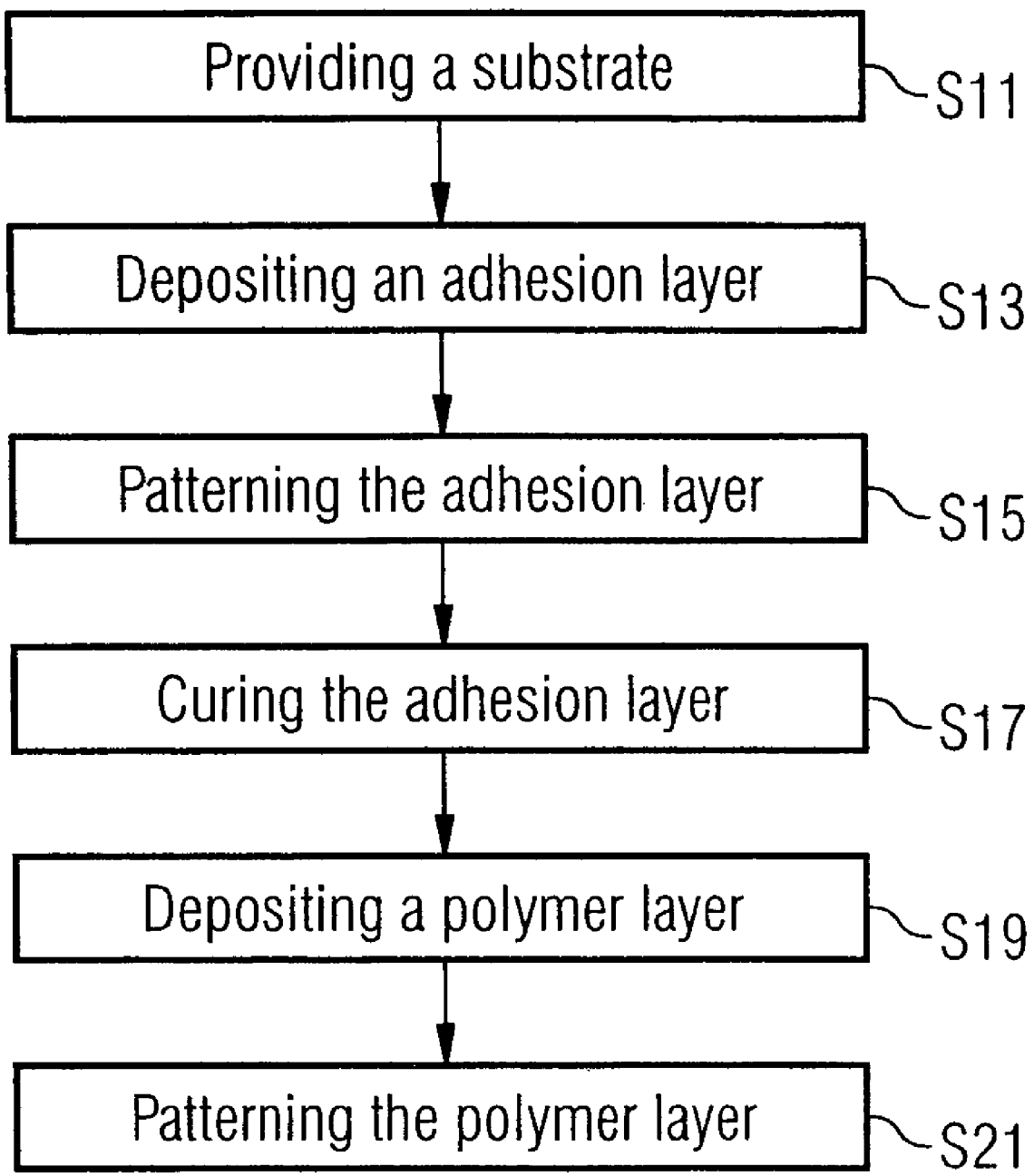

METHOD FOR PRODUCING A POLYMER STRUCTURE ON A SUBSTRATE SURFACE

CROSS-REFERENCE TO RELATED APPLICATION

This application claims priority from German Patent Application No. 10 2005 013 300.2, which was filed on Mar. 22, 2005, and is incorporated herein by reference in its entirety.

BACKGROUND OF THE INVENTION

1. Field of the Invention

The present invention relates to a method for producing a polymer structure on a substrate surface.

2. Description of Related Art

In semiconductor devices, circuit structures are arranged in cavities to an increasing extent. The cavity serves to provide a clearance above a circuit structure formed in a substrate. This clearance is necessary for a correct functionality of the circuit structure implemented in the substrate. These circuit elements may, for example, comprise microelectromechanical systems, piezo-electric resonators, such as, for example, BAW or bulk acoustic wave filters.

Such a cavity may, for example, be formed in a polymer structure. In order to produce such a cavity, large structures having a high aspect ratio, i.e. a high ratio of a height or thickness of the polymer structure to a length or width of the polymer structure on a substrate are often required. Here, aspect ratio means the ratio of the height to the length or width of the cuboid-shaped polymer structure. An SU-8 photoresist or photo epoxide, for example, is used here as a polymer. Adhesion problems arise on many foundations or surfaces of the substrate. These adhesion problems result from the stress forming when curing or heating the polymer structure through the accompanying shrinking of the polymer structure. Curing the polymer structure here is preferably performed after patterning the polymer structure. The adhesion problems cause polymer layer or polymer structure peeling, wherein the peeling of the polymer structures frequently takes place at the edges and, in particular, at the corners of the polymer structure.

This may result in the polymer structures peeling off the surface of the substrate over the lifetime of such an assembly, such as, for example, a semiconductor device having a circuit structure in a cavity. A potential consequence is for the electrical device implemented in this way to no longer have the correct electrical functionality and thus to be destroyed. Consequently, the adhesion problems of the polymer structure on the substrate entail potential reliability problems of the electrical devices implemented in this way.

The adhesion problems discussed above may, even in manufacturing, result in the polymer structures peeling off the substrate surface, wherein the manufacturing yield is decreased in mass production where polymer structures are deposited onto a substrate surface. This entails an increase in manufacturing costs for the products employing a polymer structure deposited onto the substrate surface.

A way of increasing adhesion between the polymer structure and the substrate surface is the usage of so-called primers. They are frequently based on silanes or organosilanes belonging to the group of substances of organosilicon compounds consisting of silicon atoms, a hydrolysable group and an organofunctional group. Organosilanes are generally employed as primers between an inorganic surface, such as, for example, the surface of a substrate, and a polymer or plastic. These primers, such as, for example, aminosilane, react with hydroxyl groups (—OH) on the substrate surface and thus form, with the end facing away from the oxygen molecule, a coupling molecule to the polymer structure or a polymer molecule in the polymer structure.

A disadvantage of using the primer is that the increase in adhesion depends on a presence of oxygen on the surface of the polymer. This makes the manufacturing method for substrates having polymer structures on the surfaces more complicated. With polymer structures or materials where there is little or no oxygen on the surface, this method does not result in a sufficient increase in the adhesion of the polymer structure.

A further disadvantage of using primers for increasing adhesion of a polymer structure on a substrate surface is that primers are of high stability. At the same time, primers on substrate surfaces have negative effects in a series of electrical devices, such as, for example, bulk acoustic wave filters. In bulk acoustic wave filters, the primers on the substrate surface may, for example, result in an undesired shift of the frequency response, requiring the primer to be removed selectively.

In many cases, removing the primer can only take place using strong etching agents or solvents, such as, for example, strongly oxidizing acid mixtures or lyes. Here, removing the primer may result in etching or removing material at a sensitive position of the substrate surface, wherein the functionality of a circuit structure implemented in the substrate may, for example, be impeded.

Consequently, removing material on active sensitive surfaces of the substrate, such as, for example, on a surface of a bulk acoustic wave filter, may result in influencing the electrical behavior of the bulk acoustic wave filter and may thus, for example, change the frequency response of the bulk acoustic wave filter. This may result in even the resonant frequency of the bulk acoustic wave filters implemented in the substrate to change, wherein the resonant frequency might even no longer be in the specified range. The bulk acoustic wave filters, the resonant frequency of which is outside the specified range, are not suitable for being employed in an electrical device and are consequently frequently disposed of after testing the bulk acoustic wave filters. The result is that the manufacturing yield is reduced, which at the same time entails an increase in the manufacturing costs.

SUMMARY

To address the above needs, the embodiments disclosed herein provide a method for producing a polymer structure on a substrate surface, which results in relatively lower costs and allows a more reliable adhesion of the polymer structure on the substrate surface.

In accordance with a first embodiment, the present invention provides a method for producing a polymer structure on a patterning region of a substrate surface, comprising the steps of depositing an adhesion layer comprising a first polymer material onto the substrate surface, patterning the adhesion layer so that the first polymer material of the adhesion layer is removed in a first region and the first polymer material of the adhesion layer remains in a second region including the patterning region, depositing a polymer structure of a second polymer material onto the substrate surface and the adhesion layer and patterning the polymer layer such that the polymer structure forms in the second region.

An advantage of this embodiment of the present invention is based on the finding that an adhesion layer comprising a first polymer material may be deposited onto a substrate surface and patterned such that it will remain in a region including the patterning region on the substrate surface. A polymer layer subsequently deposited onto the adhesion layer and the substrate surface comprising a second polymer material may be patterned such that it will also remain in the region including the patterning region. A polymer structure produced in this way including the remaining adhesion layer and the remaining polymer layer will have an improved adhesion on the substrate surface.

The remaining adhesion layer, which is preferably very thin in relation to the polymer layer deposited thereon, may be cured after patterning the adhesion layer. This may further increase adhesion of the polymer layer subsequently deposited onto the adhesion layer.

By increasing the adhesion of the polymer structure on the substrate surface, products comprising a polymer structure on a substrate surface, such as, for example, bulk acoustic wave resonators, being arranged in a cavity of the polymer structure can be produced including a higher yield. The probability of the polymer structure peeling off at the corners or edges is reduced by the improved adhesion of the polymer structure on the substrate surface, compared to a conventional method for producing a polymer structure on a substrate surface. Thus, fewer products having a polymer structure deposited onto a substrate surface need to be discarded in industrial mass production. The increased yield has the result that these products can be produced cheaper.

At the same time, the improvement in the adhesion of the polymer structure on the substrate surface results in the products where a polymer structure is deposited onto a substrate surface to exhibit higher reliability. The probability of the polymer structure peeling off from the substrate surface during the lifetime of the product is reduced by an improved adhesion between the polymer structure on the substrate surface.

Furthermore, polymer structures having higher aspect ratios may be produced by improving the adhesion between the polymer structure and the substrate surface. This results in an extension of the ways in which polymer structures on substrate surfaces may be employed. As has already been mentioned, a poor adhesion between the polymer structure and the substrate surface is particularly critical with a high aspect ratio of the polymer structure. In a series of applications, a poor adhesion of the polymer structure on the substrate surface is a limiting factor for the magnitude of the aspect ratio of a polymer structure.

Additionally, primers, such as, for example, silane, are no longer required due to the improvement in the adhesion of the polymer structure on the substrate surface. These primers are, as has already been discussed above, difficult to remove, wherein, for example when removing the primers, the circuit structure implemented in the substrate may even be destroyed. Thus, the yield of the electrical devices comprising a polymer structure having been produced on a substrate surface by a method according to an embodiment of the present invention is increased.

BRIEF DESCRIPTION OF THE DRAWINGS

Embodiments of the present invention will be detailed subsequently referring to the appended drawings, in which:

FIG. 1 shows a flow of a method for producing a polymer structure on a substrate surface;

DETAILED DESCRIPTION

Figure 2A:
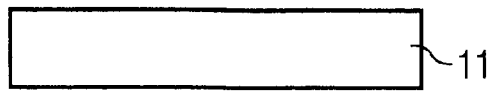
FIGS. 2a-e are schematic views of a substrate on which a polymer structure is produced according to the method discussed in FIG. 1.
Figure 2B:
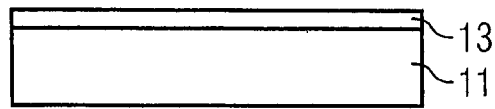

Subsequently, the flow of a method according to an embodiment of the present invention will be discussed referring to FIG. 1 and FIGS. 2a-e. A substrate 11 is provided in a step S11. The substrate 11 provided in step S11 is shown in FIG. 2a. An adhesion layer 13 is deposited onto the substrate 11 in a step S13, the adhesion layer comprising a first polymer material. A multi-layered setup produced in this way is illustrated in FIG. 2b, showing the substrate 11 including the adhesion layer 13 deposited thereon.

Figure 2C:
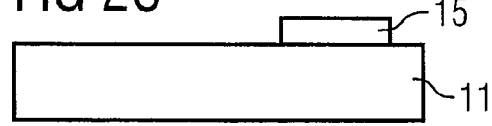

In a step S15, the adhesion layer 13 is patterned such that the adhesion layer 13 is removed on the substrate 11 in a first region. A remaining adhesion layer 15 is left in a second region including the patterning region. An assembly formed in this way is shown in FIG. 2c. It will be appreciated that the term "layer" as used herein includes all definitions typical of those used in the semiconductor fabrication arts as well as portions of layers.

Subsequently, the adhesion layer 15 remaining on the substrate 11 in the second region is cured in a step S17. Here, the multi-layered setup shown in FIG. 2c is, for example, introduced into an oven in order to cure the remaining adhesion layer 15 over a predetermined period of time using elevated temperatures.

Figure 2D:
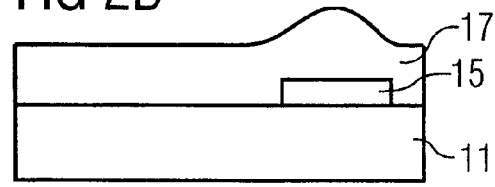

In a step S19, a polymer layer 17 comprising a second polymer material is deposited onto the remaining adhesion layer 15 and a surface of the substrate 11. A multi-layered setup formed in this way consisting of the substrate 11, the remaining adhesion layer 15 and the polymer layer 17 deposited onto both layers, is shown in FIG. 2d.

In a step S21, the polymer layer 17 is patterned such that only the region of the polymer layer 17 deposited in the second region of the substrate surface and thus on the remaining adhesion layer 15 will remain. In the first region of the substrate surface not covered by the remaining adhesion layer 15, the polymer layer 17 is removed when patterning S21. A multi-layered setup formed in this way is shown in FIG. 2e, which shows the substrate 11, the remaining adhesion layer 15 and the polymer layer 19 remaining after patterning the polymer layer 17.

A polymer structure 21 produced on the substrate surface consists of the remaining adhesion layer 15 and the remaining polymer layer 19. The polymer structure 21 here has a height 23 and a width 25.

Figure 2E:
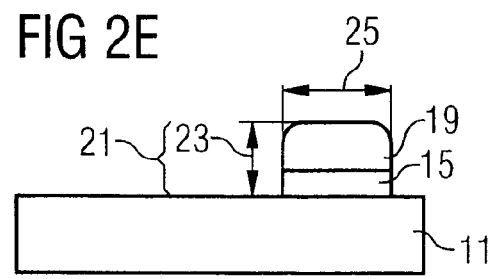
Figure 2F:
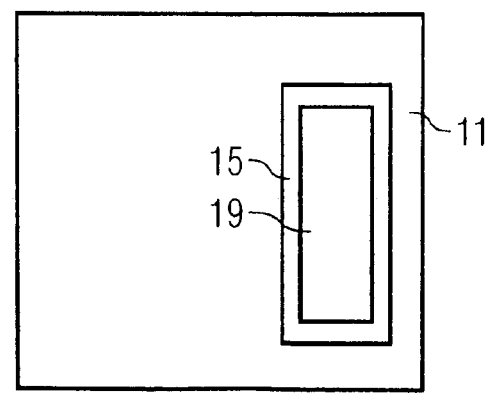
FIG. 2f is a top view of the setup shown in FIG. 2e.

FIG. 2f shows a top view of the setup illustrated in FIG. 2e. Here, it can be seen that the external dimensions or a length and width of the remaining polymer layer 19 are preferably smaller than the dimensions of the remaining adhesion layer 15.

The adhesion of the polymer structure 21 on the substrate surface is improved by the method described above of producing the polymer structure 21 on the surface of the substrate 11 by at first producing the patterned remaining adhesion layer 13 on the substrate surface and by subsequently depositing and patterning a polymer layer 17 on the remaining adhesion layer 15. The remaining adhesion layer 13 serves to improve adhesion of the polymer structure 21 on the substrate surface, wherein the remaining polymer layer 19 in turn preferably has a good adhesion on the remaining adhesion layer 15.

The adhesion layer 13 may thus exemplarily comprise a photoresist, such as, for example, a thin photoresist layer, the thickness of which is in a range from 0.1 to 10 µm, which is patterned and subsequently cured. Subsequently, a polymer layer 17 which, for example, also comprises a photoresist, may be deposited onto the remaining adhesion layer 15, wherein the deposited polymer layer is preferably characterized by a greater thickness than the adhesion layer 13. The thickness of the polymer layer 17 or of the thick resist is, for example, in a range from 30 µm to 100 µm. The second polymer material of the second polymer layer thus exemplarily comprises a photoresist which is preferably compatible with the first polymer material also comprising a photoresist.

Compatibility of the second polymer material and the first polymer material in the present application means the fact that the second polymer material is chemically formed such that it comprises an improved adhesion with regard to the first polymer material. This improved adhesion may exemplarily occur when the first polymer material and the second polymer material both comprise the same photoresist.

When a photoresist which is characterized by a low viscosity is used as the first polymer material, the result will be an improved wetting of the substrate surface. This results in a further improvement in the adhesion of the polymer structure 21 comprising the remaining adhesion layer 15 and the remaining polymer layer 19 on the substrate surface.

Exemplarily, in the above embodiment according to the present invention, the first polymer material may comprise a patternable photoresist. The patternable photoresist is well suited to act as a primer for a subsequently deposited remaining polymer layer 19 comprising a photoresist having a great thickness or a thick resist.

This is of particular advantage when the polymer structure 21 produced in the above method according to an embodiment of the present invention is characterized by a high aspect ratio. Aspect ratio means the ratio of the height 23 of the polymer structure 21 to the width 25 of the polymer structure 21.

The photoresist from which the adhesion layer 13 is formed may preferably be patternable in any manner and comprise the characteristic that it can be developed by an organic solvent which is used when patterning the adhesion layer 13. Thus, sensitive regions in the substrate 11 are not attacked when patterning the adhesion layer 13 during development, even though the adhesion layer 13 is completely removed, as intended, in the first region of the substrate surface.

Removing the adhesion layer 13 outside the second region of the substrate surface may be improved further by using an oxygen plasma, since the oxygen plasma has the characteristic of being able to remove organic residues, such as, for example, residues of polymers on the substrate surface. The remaining adhesion layer 15 may be baked using an elevated temperature in the subsequent step of curing S17 such that the stress is reduced as intended due to the elasticity of the thin remaining adhesion layer 15 or the photoresist layer. A prerequisite for a good adhesion of the remaining polymer layer 19 on the remaining adhesion layer 15 is that the first polymer material of the adhesion layer 13 and the second polymer material of the polymer layer 17 are selected suitably and are compatible to each other. Of advantage for the adhesion of the remaining polymer layer 19 on the remaining adhesion layer 15 is, for example, for the first polymer material and the second polymer material each to comprise an SU-8 photoresist.

In wafer level packaging for example, cavities having a high aspect ratio may be produced by the above-mentioned method according to an embodiment of the present invention using an SU-8 photoresist as a first and a second polymer material. Piezo-electric resonators, such as, for example, bulk acoustic wave filters, may then be disposed in the cavities produced in this way.

When producing the cavities, high mechanical stress frequently forms in the SU-8 structures forming the cavity. This may, for example, result in the polymer structure 21 having adhesion problems on the surface of the substrate 11, which may exemplarily occur especially when the substrate 11, which may, for example, be a wafer, is covered by a nitride. Here, it is of advantage for an adhesion layer 13, such as, for example, a thin layer of a low-viscous SU-8 photoresist, such as, for example, an SU-8 5 photoresist, to be deposited after the conventional pretreatment of the substrate 11, here of the wafer covered with nitride, to improve adhesion. This adhesion layer 13 is patterned corresponding to the footprint or the dimensions of the polymer structure 21 to be formed in which subsequently a cavity is to be formed. The remaining adhesion layer 15 is subsequently cured after the step of patterning S15 the adhesion layer 13. Curing may, for example, be performed in an oven in which a temperature of 200° C. is applied to the substrate including the remaining adhesive layer 13, for example for a period of time of 10 minutes.

It is of advantage here for the external dimensions or the length and width of the remaining adhesive layer 15, which is frequently referred to as resist measure, to be somewhat greater, for example in a range of 0.1 to 5 µm, than the width and the length of the remaining polymer layer 19. The dimensions of the remaining adhesion layer 15 including the polymer structure 21 additionally depend on the adjusting precision of a photo technique or photo mask used when patterning S15 the adhesion layer 13. Preferably, the second polymer material also comprises an SU-8 photoresist, wherein the second polymer material may comprise a photoresist having a higher viscosity, such as, for example, an SU-8 50 photoresist. Frequently, the thickness or height of the remaining polymer layer 19 is greater than the height of the remaining adhesion layer 15, which is why the remaining adhesion layer 15 may be referred to as a thin resist and the remaining polymer layer 19 be referred to as a thick resist.

Peeling of the polymer structure 21, as frequently arises with conventional methods, is avoided by the embodiment described above of the polymer structure 21, the thin remaining adhesion layer 15 and the thick remaining polymer layer 19. The adhesion of the thick remaining polymer layer 19 on the surface of the substrate 11 is increased by the remaining adhesion layer 15 arranged between the remaining polymer layer 19 and the surface of the substrate 11.

Subsequently, two polymer structures on the surface of the substrate are compared, of which one has been produced according to an embodiment of the present invention, whereas the other one has been produced according to the conventional method. In the subsequent description of exemplary embodiments, same elements or elements having the same effect will be provided with the same reference numerals.

Figure 3:
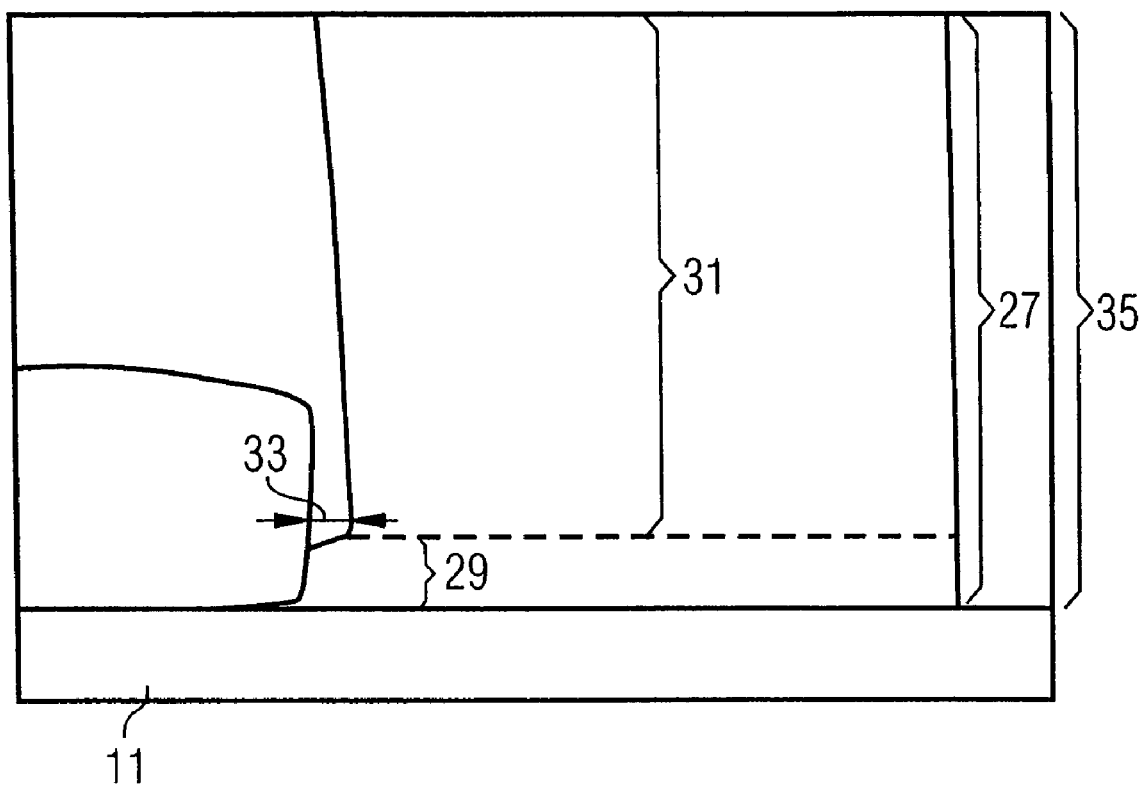
FIG. 3 shows a comparison of a polymer structure on a substrate surface having been produced according to a conventional method, compared to a polymer structure having been produced according to the method according to an embodiment of the present invention.

FIG. 3 shows a polymer structure sector 27 on the substrate 11, formed of a thin photoresist layer 29 and a sector of a thick photoresist layer 31. The thin photoresist layer 29 and the thick photoresist layer 31 of which only the sector is shown, have been deposited onto the substrate 11 one after the other according to an embodiment of the present invention. Preferably, the thin photoresist layer 29 has a greater width than the thick photoresist layer 31. The thin photoresist layer 29 exemplarily comprises a height of 3 µm and is formed of an SU-8

5 photoresist, whereas the thick photoresist layer 31 exemplarily comprises a height of more than 100 μm and is formed of an SU-8 50 photoresist.

A difference 33 in width between the width of the thin photoresist layer 29 and the width of the thick photoresist layer 31 is also shown in FIG. 3. Depositing the thick photoresist layer 31 onto the thin photoresist layer 29 in FIG. 3 serves to increase the adhesion of the polymer structure on the surface of the substrate 11. A sector of a polymer structure 35 having been produced according to the conventional method is also illustrated in FIG. 3. The polymer structure 35 comprises a single thick continuous photoresist layer, exemplarily made of an SU-8 50 photoresist.

When optically examining the two polymer structures, it becomes evident that the polymer structure 35 having been produced according to the conventional method has a poorer adhesion and peels off from the surface of the substrate 11 at the edges and, in particular, at the corners. This peeling has not been observed with the polymer structure having been produced according to an embodiment of the present invention, of which in FIG. 3 the sector 27 is shown.

In the above embodiment according to the present invention, the first polymer material exemplarily comprises a photoresist and, preferably, an SU-8 photoresist, any polymer materials, such as, for example, plastics, being alternatives. In the above embodiment of the present invention, the second polymer material exemplarily comprises a photoresist, preferably an SU-8 photoresist, any polymer materials, such as, for example, plastics, being alternatives.

In the above embodiment, the second polymer material exemplarily comprises a higher viscosity than the first polymer material and, more preferably, a viscosity being higher by a factor in the range from 5 to 15 than the viscosity of the first polymer material, any relations of the viscosities of the first polymer material and the second polymer material being alternatives.

In the above embodiment of the present invention, the thickness of the adhesion layer is exemplarily in a range of less than 10 μm and preferably in a range of 0.1 μm to 10 μm and more preferably in a range from 2 μm to 3 μm, any thicknesses of the adhesion layer being alternatives.

In the above embodiment of the present invention, a relation of a thickness of the remaining polymer layer 19 and a thickness of the remaining adhesion layer 15 is exemplarily in a range from 4 to 100 and preferably in a range from 10 to 50. However, any relations of the thickness of the remaining polymer layer 19 and the thickness of the remaining adhesion layer 15 are alternatives.

In the above embodiment of the present invention, the thickness of the polymer layer 17 is exemplarily in a range from 40 μm to 100 μm, any thicknesses of the polymer layer 17 being alternatives. In the above embodiment of the present invention, the polymer structure 21 exemplarily comprises a basically cuboid-shaped form and an aspect ratio in a range from 0.04 to 10, any forms of the polymer structure being alternatives. The aspect ratio here frequently depends on the direction so that, for example, an aspect ratio in a range from 0.4 to 10 results in one direction of the cuboid-shaped polymer structure and an aspect ratio in a range from 0.04 to 1 results in a perpendicular direction.

In the method according to the above embodiment of the present invention, the method is performed such that a relation between a maximum distance between two points of a periphery of the patterning region and a maximum height of the polymer structure (21) is preferably in a range of 4 to 1000, any relations of the maximum distance and the maximum height being alternatives.

In the method according to the above embodiment of the present invention, the step of patterning (S21) the polymer layer (17) is performed such that preferably the second region is greater than the patterning region and a distance of an outline edge of the second region to an outline edge of the patterning region is in a range from 0.1 μm to 5 μm and, more preferably, at least over half of a length of the outline edge of the second region, the distance of the outline edge of the second region to the outline edge of the patterning region is in a range from 0.1 μm to 5 μm. Any distances of the outline edge of the second region to the outline edge of the patterning region are alternatives. Also, the outline edge of the second region and the outline edge of the patterning region may be formed in a flush manner.

In the above embodiment of the present invention, the step of curing S17 the remaining adhesion layer 15 is exemplarily performed at a temperature in a range from 150° C. to 250° C. and preferably in a range from 190° C. to 210° C., any temperatures when curing S17 being alternatives. In the above embodiment of the present invention, curing S17 the remaining adhesive layer 15 is exemplarily performed over a period of time in a range from 5 to 50 minutes and preferably over a period of time in a range from 8 to 12 minutes, any periods of time for performing the curing S17 being alternatives.

In the above embodiment of the present invention, it is explained that a cavity in which a piezo-electric resonator, such as, for example, a bulk acoustic wave filter, may be disposed, can be produced by means of the method of the present invention. Any devices may, however, be disposed in the cavity formed by the substrate surface and the polymer structure. The polymer structure here has been produced according to a method according to the embodiment of the present invention. In the above embodiment of the present invention, the second region which includes the patterning region and in which the remaining adhesion layer 15 is arranged, may include any region of a surface of the substrate 11 or even include the entire surface of the substrate 11.

In the above embodiment, in FIG. 2f the remaining polymer layer 19 preferably comprises greater external dimensions than the remaining adhesive layer 15, the remaining polymer layer 19 and the remaining adhesive layer 15, however, could also be formed in a flush manner.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. Method for producing a polymer structure, comprising the steps of:
    depositing an adhesion layer comprising a first photoresist polymer onto a substrate surface;
    patterning the adhesion layer such that the first photoresist polymer of the adhesion layer is removed in a first region and the first photoresist polymer of the adhesion layer remains in a second region;
    providing a polymer layer of a second photoresist polymer on the adhesion layer over substantially only the second region;
    wherein the second photoresist polymer comprises SU-8 of a first viscosity and the first photoresist polymer comprises SU-8 of a second viscosity being higher than the first viscosity by a factor in a range from 5 to 15 and wherein a thickness of the polymer layer is greater than a thickness of the adhesion layer by a factor in a range from 4 to 1000.

2. The method according to claim 1, wherein providing the polymer layer further comprises:
   depositing the polymer layer of the second photoresist polymer onto the substrate surface and the adhesion layer; and
   patterning the polymer layer such that the polymer layer and the adhesion layer form the polymer structure, the polymer structure formed within a patterning region included in the second region.

3. The method according to claim 1, wherein a thickness of the adhesion layer is in a range of less than 10 μm.

4. The method according to claim 1, wherein the step of patterning the adhesion layer is followed by a step of curing the adhesion layer.

5. The method according to claim 4, wherein the step of curing is performed at a temperature in a range from 150° C. to 250° C.

6. The method according to claim 4, wherein a duration in which the step of curing is performed is in a range from 5 minutes to 50 minutes.

7. The method according to claim 1, wherein a thickness of the polymer layer is in a range from 40 μm to 100 μm.

8. The method according to claim 1, wherein a maximum distance between two points of a periphery of the second region and is greater than a maximum height of the polymer structure by a factor in a range from 4 to 1000.

9. The method according to claim 2, wherein the step of patterning the polymer layer is performed such that the second region is greater than the patterning region and a distance of an outline edge of the second region to an outline edge of the patterning region is in a range from 0.1 μm to 5 μm.

10. The method according to claim 2, wherein the step of patterning the polymer layer is performed such that the second region is greater than the patterning region and, at least over half of a length of an outline edge of the second region, a distance of the outline edge of the second region to an outline edge of the patterning region is in a range from 0.1 μm to 5 μm.

11. The method according to claim 1, wherein a polymer structure and the substrate surface enclose a cavity, the polymer structure including the adhesion layer and the polymer layer.

12. The method according to claim 11, wherein a piezoelectric resonator is arranged in the cavity.

13. The method according to claim 12, wherein the piezoelectric resonator is formed as a bulk acoustic wave resonator.

14. A method, comprising:
   providing an adhesion layer comprising a first photoresist polymer onto a substrate surface, the adhesion layer absent from a first region of the substrate and the adhesion layer occupying a second region of a substrate, the adhesion layer having a first thickness; and
   providing a polymer layer of a second photoresist polymer on the adhesion layer in substantially only the second region, the polymer layer having a second thickness at least four times the first thickness;
   wherein the first and the second photoresist polymers comprise SU-8; and
   wherein the steps of providing are performed such that a distance of an outline edge of a patterning region within which the polymer layer overlays the adhesion layer, and an outline edge of the second region is, at least over half of a length of the outline edge of the second region, in a range from 0.1 μm to 5 μm.

15. The method according to claim 14, wherein the step of providing the adhesion layer further comprises patterning an initial adhesion layer to form the adhesion layer and curing the adhesion layer.

* * * * *